United States Patent [19]
Morie et al.

[11] Patent Number: 4,645,564
[45] Date of Patent: Feb. 24, 1987

[54] METHOD OF MANUFACTURING SEMICONDUCTOR DEVICE WITH MIS CAPACITOR

[75] Inventors: Takashi Morie; Kazushige Minegishi; Shigeru Nakajima, all of Kanagawa, Japan

[73] Assignee: Nippon Telegraph & Telephone Public Corporation, Tokyo, Japan

[21] Appl. No.: 712,860

[22] Filed: Mar. 18, 1985

[30] Foreign Application Priority Data

Apr. 19, 1984 [JP] Japan .................................. 59-79682

[51] Int. Cl.$^4$ ...................... H01L 21/306; B44C 1/22; C03C 15/00; C03C 25/06
[52] U.S. Cl. .............................. 156/643; 29/576 W; 29/580; 148/187; 148/DIG. 50; 156/646; 156/648; 156/651; 156/653; 156/657; 156/662; 357/51; 357/55
[58] Field of Search ............... 156/643, 646, 648, 650, 156/651, 657, 659.1, 662, 653; 148/1.5, 187, DIG. 50; 29/576 W, 580; 357/49, 51, 55, 59; 427/93, 86; 252/79.1

[56] References Cited

U.S. PATENT DOCUMENTS 4,495,025 1/1985 Haskell .................................. 156/648
4,534,824 8/1985 Chen .................................... 156/648

OTHER PUBLICATIONS

Japanese Utility Model Preliminary Publication Sho 56-43171, Apr. 20, 1981, p. 147.

Primary Examiner—William A. Powell
Attorney, Agent, or Firm—Blakely, Sokoloff, Taylor & Zafman

[57] ABSTRACT

A semiconductor device with a metal-insulator-semiconductor capacitor has:
a semiconductor substrate having a predetermined conductivity type and serving as one electrode of the metal-insulator-semiconductor capacitor, the semiconductor substrate being provided with a trench of a cross-sectionally rectangular shape which extends along a direction of thickness of the semiconductor substrate from a major surface thereof;
a doped semiconductor layer formed along at least side wall surfaces of the trench, the semiconductor layer, which is formed by deposition and etching, being provided with an outer surface, starting to extend in a rounded shape from major surface portions of the semiconductor substrate and extending substantially parallel to the side wall surfaces of the trench, and a recess, which is defined by the semiconductor layer, having round corners at the bottom;
a dielectric insulating layer formed on an exposed surface including the major surface of the semiconductor substrate and the outer surface of the semiconductor layer; and
a conductive layer formed on the insulating layer to bury trench and serving as the other electrode.

6 Claims, 27 Drawing Figures

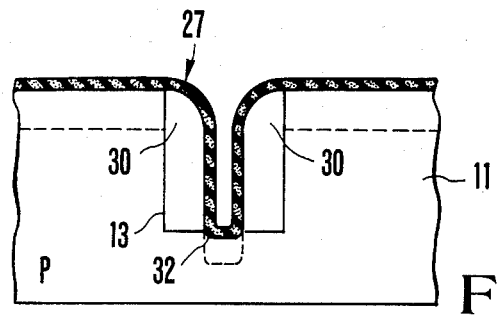
F I G. 5C
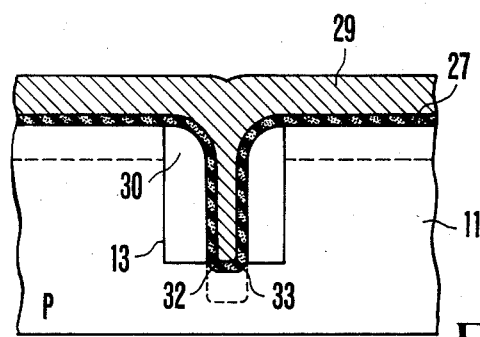
F I G. 5D
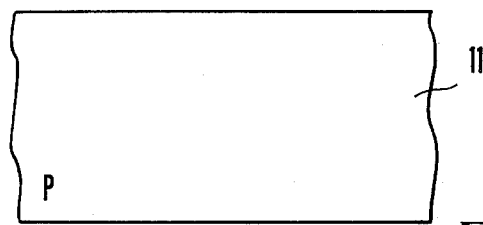
F I G. 6A
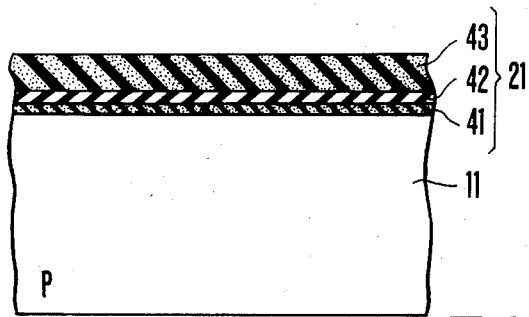
F I G. 6B

METHOD OF MANUFACTURING SEMICONDUCTOR DEVICE WITH MIS CAPACITOR

BACKGROUND OF THE INVENTION

The present invention relates to a semiconductor device with a MIS capacitor and a method of manufacturing the same.

Along with the trend for higher packing density of semiconductor ICs, requirements for miniaturizing of various components have become stricter. Among these various requirements it becomes difficult in obtaining a predetermined capacitance for a capacitor used together with a semiconductor element when the size of the capacitor is decreased. The size of the capacitor presents a restriction to further miniaturization of a semiconductor memory with capacitors. In order to resolve this problem, a conventional semiconductor device is proposed as shown in FIG. 1. A straight trench 13 having a width of 0.4 to 1.0 μm and a length of 0.5 to 5 μm is formed in a p-type silicon semiconductor substrate 11. Phosphorus is diffused by using phosphosilicate glass (PSG) in the surface of the substrate 11 to form an n-type layer. Thereafter, a silicon oxide (SiO$_2$) layer 27 is formed on the substrate 11 to a thickness of 10 to 50 nm to serve as a dielectric insulating layer. A CVD-polysilicon layer 29 serving as an electrode is deposited in the trench to a thickness of 0.3 to 0.7 μm, thereby preparing a depletion type capacitor. A typical example of this arrangement is described in "Depletion Trench Capacitor Technology for Megabit Level MOSDRAM" by MORIE et. al., *IEEE ELECTRON DEVICE LETTERS*, Vol. Ed. 2-4, No. 11, November 1983, pp. 411–414.

However, in a capacitor of this type, since the silicon oxide layer as the dielectric insulating layer is directly formed by thermal oxidation in a trench of cross-sectionally rectangular shape, the thickness of the silicon oxide layer at the corners, especially at the edges of the trench opening is decreased. As shown in FIG. 1, acute portions 13A and 13B are formed in the silicon substrate and the electrode. When the resultant structure is used as a capacitor, an electric field is concentrated at the thin portions, thereby decreasing the dielectric breakdown voltage of the capacitor.

When the above-mentioned trench is to be formed by a simple and low-cost photolithography technique, it is difficult to decrease the width of the trench to about 1 μm or less. When a trench is formed by the photolithography technique and an electrode layer is to be formed on the dielectric layer formed in the trench and having a predetermined thickness after the trench is formed, the thickness of the electrode layer must be 0.8 μm or more in order to make the surface of the electrode layer flat. However, in order to obtain such an electrode, productivity is degraded even if any one of doped-polysilicon, molybdenum, tungsten and aluminum is used as an electrode material, thus resulting in inconvenience.

When the n-type layer is formed such that phosphorus is diffused from the PSG layer deposited in the trench, a phosphorus concentration contained in the PSG layer, a diffusion temperature and a diffusion time must be controlled so as to obtain desired concentration and thickness of the n-type layer. However, since a plurality of elements are formed on a single chip in LSIs, the undesirable redistribution of doped impurities in other elements during the diffusion operation for forming the n-type layer must be considered, thereby limiting versatility of process design.

In addition, since the n-type layer is formed to extend outward from the trench, the width of the resultant trench capacitor is larger than the designed trench width by twice the width of the n-type layer. The thickness of the n-type layer is normally about 0.2 μm and cannot be neglected for high packing density of elements.

SUMMARY OF THE INVENTION

It is, therefore, a principal object of the present invention to provide a semiconductor device with a MIS capacitor having a higher dielectric breakdown voltage than that of the conventional trench device, and a method of manufacturing the same.

It is another object of the present invention to provide a semiconductor device with an improved MIS capacitor having desired dielectric breakdown voltage characteristics and good reproducibility, and a method of manufacturing the same.

It is still another object of the present invention to provide a semiconductor device with a MIS capacitor wherein a trench can be simply formed and buried to obtain a flat surface, and a method of manufacturing the same.

It is still another object of the present invention to provide a semiconductor device with a MIS capacitor having the same width as the designed width, and a method of manufacturing the same.

It is still another object of the present invention to provide a semiconductor device with a MIS capacitor wherein a signal charge can be stored and transferred without using a special power source, and a method of manufacturing the same.

According to an aspect of the present invention, there is provided a semiconductor device with a metal-insulator-semiconductor capacitor, comprising:

a semiconductor substrate having a predetermined conductivity type and serving as one electrode of the metal-insulator-semiconductor capacitor, the semiconductor substrate being provided with a trench of a cross-sectionally rectangular shape which extends along a direction of thickness of the semiconductor substrate from a major surface thereof;

a doped semiconductor layer formed along at least side wall surfaces of the trench, the semiconductor layer, which is formed by deposition and etching, being provided with an outer surface, starting to extend in a rounded shape from major surface portions of the semiconductor substrate and extending substantially parallel to the side wall surfaces of the trench, and a recess, which is defined by the semiconductor layer, having round corners at the bottom;

a dielectric insulating layer formed on an exposed surface including the major surface of the semiconductor substrate and the outer surface of the semiconductor layer; and a conductive layer formed on the insulating layer to bury the trench and serving as the other electrode.

According to another aspect of the present invention, there is provided a method of manufacturing a semiconductor layer with a metal-insulator-semiconductor capacitor, comprising the steps of:

forming a trench of a cross-sectionally rectangular shape in a major surface of a semiconductor substrate which has a predetermined conductivity type and which serves as one electrode of the capacitor;

forming a doped semiconductor layer along at least side wall surfaces of the trench, the step of forming the semiconductor layer including the steps of depositing a semiconductor portion so as not to bury the trench with the semiconductor portion and etching at least a part of the semiconductor portion, the semiconductor layer, which is formed by deposition and etching, being provided with an outer surface, starting to extend in a rounded shape from major surface portions of the semiconductor substrate and extending substantially parallel to the side wall surfaces of the trench, and a recess, which is defined by the semiconductor layer, having round corners at the bottom;

forming a dielectric insulating layer on an exposed surface including the major surface of the semiconductor substrate and the outer surface of the semiconductor layer; and forming a conductive layer on the insulating layer to bury the trench and serving as the other electrode.

BRIEF DESCRIPTION OF THE DRAWINGS

FIGS. 5A to 5D are sectional views for explaining the steps in manufacturing a semiconductor with a MIS capacitor according to another embodiment of the present invention; and FIGS. 6A to 6L are sectional views for explaining the steps in manufacturing a semiconductor with a MIS capacitor according to still another embodiment of the present invention.

DESCRIPTION OF THE PREFERRED EMBODIMENTS

Figure 1:
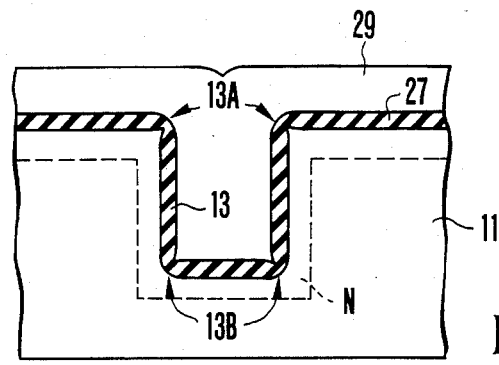
FIG. 1 is a sectional view showing a conventional MIS trench capacitor.
Figure 2:
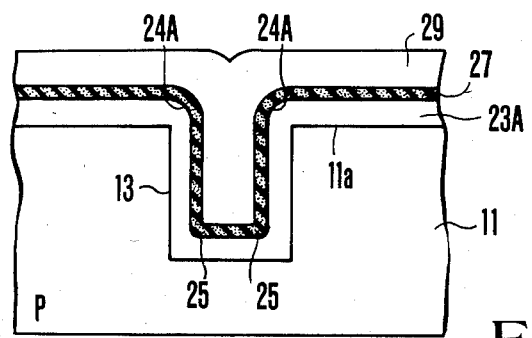
FIG. 2 is a sectional view of a capacitor portion of a semiconductor device with a MIS capacitor according to an embodiment of the present invention.

FIG. 2 shows a semiconductor device with a MIS capacitor according to an embodiment of the present invention, and particularly showing only a capacitor portion. Referring to FIG. 2, a cross-sectionally rectangular recess or trench 13 is formed in a p-type silicon substrate 11 along a direction of thickness thereof from its major surface 11a. A p or n doped silicon layer 23A is formed on the surface of the substrate 11 which includes the trench 13. The silicon layer 23A is formed such that a semiconductor layer formed by deposition such as CVD (Chemical Vapor Deposition) to be described in detail with reference to FIG. 2 is etched. For this reason, the portions of the silicon layer 23A which are formed at the edges of the opening of the trench 13 are rounded with a radius of curvature substantially corresponding to the thickness of the silicon layer 23A. Portions of the layer 23A corresponding to the corners at the bottom of the trench 13 are rounded with a given radius of curvature. In this state, a dielectric insulating layer 27 such as a $SiO_2$ layer is formed on the silicon layer 23A to a predetermined thickness. A conductive layer 29 is then formed on the insulating layer 27. In this manner, a MIS capacitor is formed such that the substrate 11 and the silicon layer 23A constitute one electrode of the capacitor, and the conductive layer 29 opposing one electrode through the dielectric insulating layer 27 constitutes the other electrode.

In this MIS capacitor, since the silicon layer 23A is deposited on the silicon substrate 11 and is etched, the edges of the layer 23A which define the trench 13 and the bottom corners of the trench 13 are rounded, and the dielectric insulating layer 27 formed on the silicon layer 23A to a predetermined thickness is rounded at the portions corresponding to the edges and the bottom corners of the trench 13. Therefore, according to the MIS capacitor of the present invention, the thickness of the dielectric insulating layer becomes substantially uniform. In addition, since the electrodes are rounded at the edges and bottom corners of the trench, the electrodes have a higher dielectric breakdown voltage than that of a conventional MIS trench capacitor since the electric field is not concentrated therein.

Although the edges and the bottom corners of the trench 13 formed in the substrate 11 have right-angled portions in the above structure, these portions are constituted by semiconductor surfaces, so that the electric field is not concentrated. Even if the electric field is concentrated, the field strength is weak. In addition, the portions 11 and 23A serve as capacitor electrodes and are not directly associated with the dielectric breakdown voltage characteristics.

When a MIS transistor is formed adjacent to the MIS capacitor, a signal charge can be transferred through the transistor to the capacitor and stored. When the silicon layer 23A of the MIS capacitor comprises an n-type layer with a predetermined impurity concentration and thickness, a voltage need not be applied to the conductive layer 29. However, when the silicon layer 23A comprises a p-type layer, a positive voltage is applied to the conductive layer 29 to form an n-type inversion layer at the surface of the layer 23A which contacts the insulating layer 27, thereby transferring the charge and storing it in the capacitor.

With the above structure, the two opposing electrodes of the capacitor are formed inside the trench, so that the width of the resultant trench capacitor is the same as the designed trench width (i.e., a pattern preset value), thereby decreasing the area of the capacitor.

Figure 4:
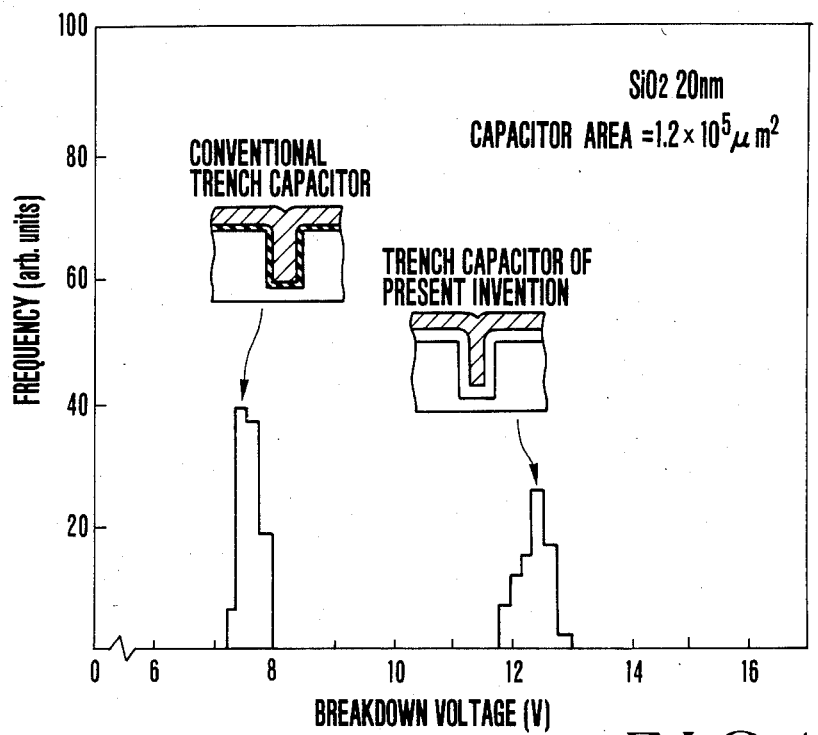
FIG. 4 is a histogram showing dielectric breakdown voltages of the capacitor of the present invention and the conventional trench capacitor.

FIG. 4 is a histogram showing dielectric breakdown voltages of the MIS capacitor of the present invention and the conventional trench MIS capacitor. The characteristics shown in FIG. 4 are obtained when each dielectric insulating layer ($SiO_2$) has a thickness of 20 nm, and an electrode area including the side surfaces and the bottom surface of the trench is given as $1.2 \times 10^5 \mu m^2$. According to these characteristics, it will be readily understood that the dielectric breakdown voltage of the MIS capacitor of the present invention is much higher than that of the conventional trench capacitor.

FIGS. 3A to 3I are sectional views for explaining the steps in manufacturing the MIS capacitor of FIG. 2.

Figure 3A:
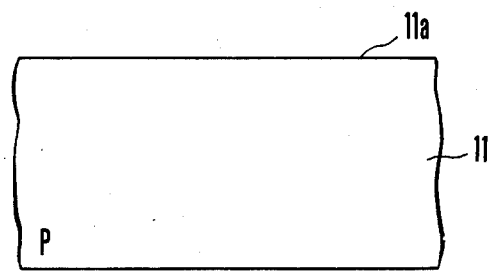
FIGS. 3A to 3H are sectional views for explaining the steps in a method of manufacturing the structure shown in FIG. 2.

As shown in FIG. 3A, a p-type single crystalline silicon substrate 11 having an impurity concentration of $10^{15}$ to $10^{16}$ cm$^{-3}$ is prepared.

Figure 3B:
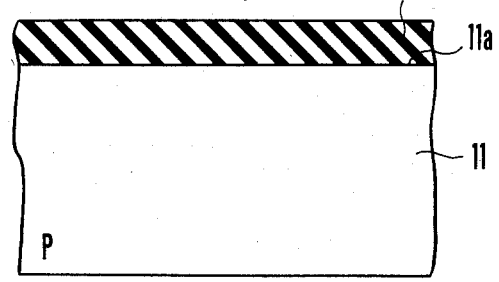

Subsequently, a silicon oxide ($SiO_2$) mask layer 21 is formed by a known thermal oxidation or CVD technique on a major surface 11a of the semiconductor substrate 11 to a thickness of about 8,000 to 10,000 Å (FIG. 3B).

Figure 3C:
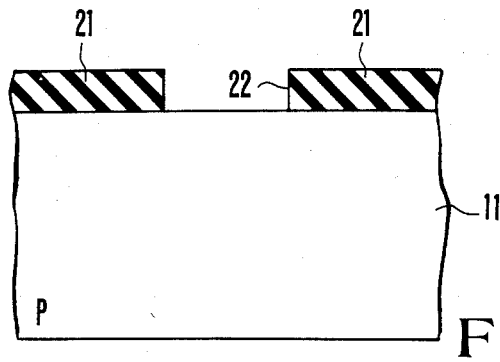

A window 22 is formed by a known photolithography technique in the mask layer 21 to partially expose the substrate 11 through the window 22 (FIG. 3C).

Figure 3D:
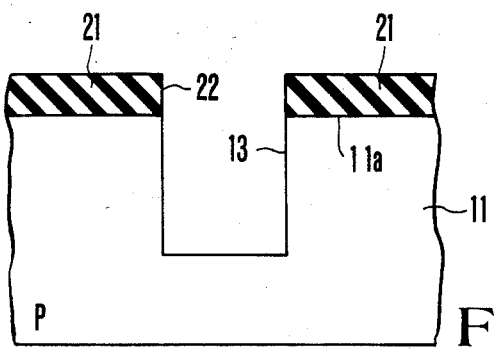
Figure 3E:
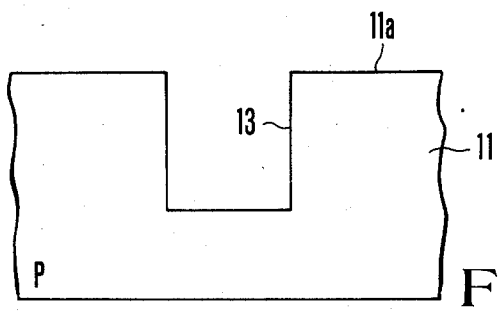

The substrate 11 is etched by a known etching technique using the mask layer 21 as a mask, thereby forming a trench 13 in the major surface 11a. The trench has a size (i.e., a width of 0.4 to 1.0 μm and a length of about 0.5 to 5 μm) corresponding to the window 22 of the mask layer 21 and a depth of 1 to 5 μm (FIG. 3D). In this case, anisotropic etching such as reactive ion etching is performed using CBrF$_3$ gas as an etchant and at a pressure of 14 to 20 mTorr and an RF power of 0.1 W/cm$^2$. The side wall surfaces of the trench 13 extend along the corresponding sides of the window 22. However, the side walls of the trench 13 which are obtained by anisotropic etching might have slightly damaged layers. In order to remove the slightly damaged layers, the side wall surface layers of the trench 13 are etched by a mixture of nitric acid and hydrofluoric acid to a depth of about 500 Å, thereby obtaining clean side walls.

The mask layer 21 is removed from the substrate 11 (FIG. 3E) by a buffered hydrofluoric acid solution.

Figure 3F:
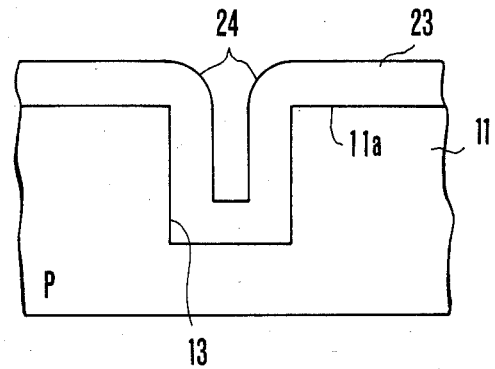

A silicon semiconductor layer 23 is formed by a known deposition technique on the exposed surface 11a (including the trench 13) of the substrate 11 (FIG. 3F). This deposition technique is typically exemplified by CVD (chemical vapor deposition). According to CVD, an undoped silicon layer having a thickness of 3,000 to 4,000 Å is formed using SiH$_4$ gas as a source gas and at a pressure of about 0.4 Torr and a temperature of about 700° to 800° C. The silicon layer is turned into an n-type silicon layer which has a concentration of $10^{18}$ to $10^{20}$ cm$^{-3}$ in accordance with a known gas diffusion technique using POCl$_3$. Another method can be used whereby an n-type silicon layer is formed to a thickness of 3,000 to 4,000 Å using a gas mixture of SiH$_4$ and PH$_3$ at a temperature of 700° to 800° C. and a pressure of 0.4 Torr. Still another method is employed where a single crystalline silicon layer is epitaxially grown by a normal or reduced pressure CVD using SiH$_4$ at a substrate temperature of 900° to 1,100° C. An impurity doped in the semiconductor layer 23 comprises a Group V or n-type impurity such as phosphorus or arsenic. The impurity may also comprise a Group III or p-type impurity such as boron. When a Group III element is used, an impurity concentration is about $10^{15}$ to $10^{16}$ cm$^{-3}$.

In this case, since the semiconductor layer 23 is formed by CVD, corners 24 of the layer 23 at the edges of the trench 13 are rounded with a radius of curvature corresponding to a thickness of the semiconductor layer 23.

Subsequently, the semiconductor layer 23 is etched by isotropic etching to a thickness of about ½. This etching aims at rounding of the corner portions at the bottom of the trench, so that the etching depth is not limited to ½ of the thickness of the semiconductor layer 23. In this etching operation, an etchant may comprise a mixture of nitric acid and hydrofluoric acid. In addition, the semiconductor layer 23 can be thermally oxidized to a depth corresponding to half of the entire thickness thereof to obtain a silicon oxide layer. In this case, the silicon oxide layer is removed by the buffered hydrofluoric acid solution.

Figure 3G:
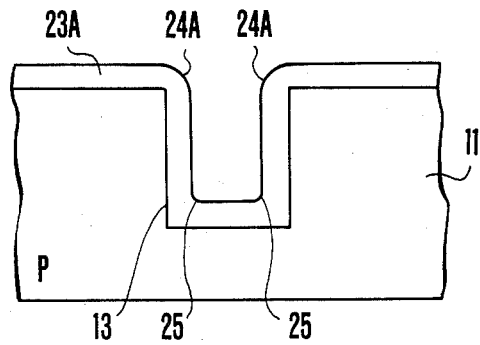

The silicon layer 23A obtained in this manner is illustrated in FIG. 3G and the silicon layer 23A defines a recess in the trench 15. As apparent in FIG. 3G, portions 24A covering the edges of the trench 13 are rounded with a radius of curvature corresponding to the thickness of the layer 23A. Corners 25 corresponding to the bottom corners of the trench 13 are also rounded by isotropic etching, so that the corner surface of the semiconductor layer 23A formed in the trench 13 is rounded at the bottom of the recess.

Figure 3H:
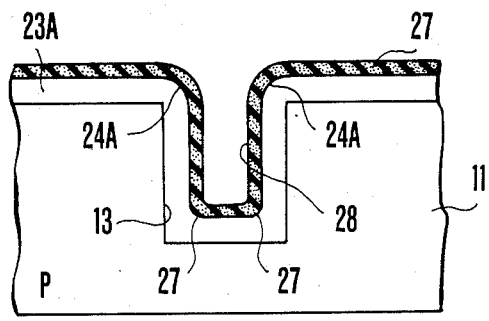

Subsequently, a thin dielectric insulating layer 27 of a thickness of about 100 to 500 Å is formed on the silicon layer 23A (FIG. 3H). The insulating layer 27 as a silicon oxide (SiO$_2$) layer is obtained by thermally oxidizing the surface layer of the silicon layer 23A. If so required, a silicon nitride layer is formed on the silicon oxide layer to obtain a double insulating structure. The insulating layer can comprise a three-layer, i.e., SiO$_2$/Si$_3$N$_4$/SiO$_2$ structure.

A conductive layer 29 is formed by a known method on the dielectric insulating layer 27 to a thickness which is larger than half of the resultant trench width, and preferably the same thickness as the trench width. In this case, the conductive layer 29 comprises a phosphorus-doped polysilicon layer obtained by CVD, or a deposited metal layer such as a molybdenum, tungsten or aluminum layer.

The MIS capacitor having the structure shown in FIG. 2 is prepared in the manner described above. A MIS transistor or other semiconductor elements are formed simultaneously when the MIS capacitor is formed or by using some of the steps of the MIS capacitor. The steps in manufacturing the transistor and other semiconductor elements are known to those who are skilled in the art and are not directly associated with the present invention, and a detailed description thereof will be omitted.

The MIS capacitor prepared as described above does not require special steps but a combination of conventional steps for forming a semiconductor element on the semiconductor substrate, thereby simplifying the manufacturing process and providing good reproducibility.

By using the method of the present invention, the controllability of the width of a trench 28 (FIG. 3H) defined by the insulating layer 27 is not so strict. In other words, when a trench is formed by normal photolithography in the semiconductor substrate, a minimum width of the trench is 0.8 μm. According to the conventional method, when the dielectric insulating layer is formed in this trench, the trench must be filled with only the conductive layer formed on the insulating layer in such a manner that a plurality of conductive layers are used, thereby degrading the productivity of semiconductor devices. However, according to the method of the present invention, the thickness of the semiconductor layer underlying the dielectric insulating layer and the thickness of the conductive layer overlying the dielectric insulating layer can be varied to control the width of the trench defined by the dielectric insulating layer. For example, when the width of the trench formed in the semiconductor substrate is given as 0.8 μm, the thicknesses of the semiconductor layer and the conductive layer are controlled to 0.2 μm and 0.5 μm, respectively, thereby completely filling the trench to obtain a flat surface of the conductive layer. As a result, as compared with the conventional method of forming a MIS capacitor in the conventional trench, the total number of steps can be decreased, and the design margin or versatility can be increased.

Figure 5A:
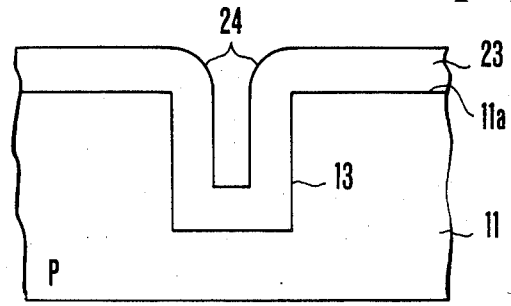

FIGS. 5A to 5D are sectional views for explaining the steps of a method of manufacturing a semiconductor device with a MIS capacitor according to another embodiment of the present invention. Referring to FIG. 5A, this step is the same as that shown in FIG. 3F. More particularly, a trench 13 is formed in a p-type silicon substrate 11, and a semiconductor layer 23 is filled in the trench and formed on the major surface of the semiconductor substrate in the same manner as the steps in FIGS. 3A to 3F.

Figure 5B:
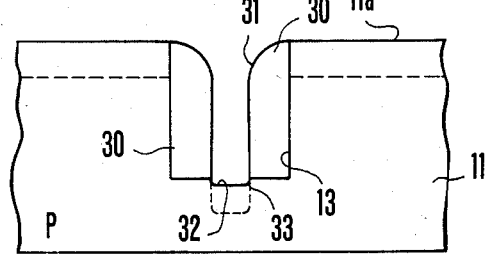

As shown in FIG. 5B, planar portions of the semiconductor layer 23 which are formed on the major surface of the semiconductor substrate 11, the bottom of the trench 13, and at the top portions of the semiconductor layer 23 which are formed along the side walls of the trench 13, are etched by, e.g., parallel-plate plasma etching using $CCl_2F_2$ gas at a pressure of 0.1 Torr or less. As a result, residual semiconductor layers 30 are left only on the side wall surfaces, i.e., vertical wall surfaces of the trench 13. The edges of residual layers 30 which contact a major surface 11a have substantially the same level as that of the major surface 11a of the semiconductor substrate 11. These top surfaces are then rounded with a radius of curvature corresponding to the thickness of the residual semiconductor layer 30 toward inside of the trench 13. At the bottom of the trench 13, the central portion of the semiconductor layer 23 is etched excluding portions which correspond to the vertical portions of the residual layers 30, and the underlying substrate portion is slightly etched to form a recess 32. Corners 33 of the recess 32 are slightly rounded since the recess 32 is formed by etching. The corners 33 smoothly continue from the outer surfaces of the vertical semiconductor layers 30 without forming steps therebetween.

As shown in FIG. 5C, a dielectric insulating layer 27 is formed on the entire surface of the resultant structure to a predetermined thickness. This step is the same as that in FIG. 3H.

As shown in FIG. 5D, a conductive layer 29 is formed on the insulating layer 27. This step is the same as that of the embodiment shown in FIG. 2. The MIS capacitor of the present invention which is characterized by the semiconductor substrate 11, the semiconductor layers 30, the dielectric insulating layer 27 and the conductive layer 29 can be prepared in the second embodiment. In this case, the dielectric insulating layer 27 formed at the edges of the trench formed in the semiconductor substrate 11 has a uniform thickness and a flat surface since the top surfaces of the underlying semiconductor layers 30 are rounded and the corners of the recess 32 are also rounded, thereby obtaining a MIS capacitor having a high dielectric breakdown voltage in the same manner as in the first embodiment.

Even if the method of the second embodiment shown in FIGS. 5A to 5D is used, a special process is not required, and a semiconductor with a MIS capacitor can easily be manufactured with good reproducibility.

Furthermore, the semiconductor layer and the conductive layer sandwich the dielectric insulating layer in the trench of the semiconductor substrate, so that the trench can be filled without forming a step. As a result, the subsequent formation of semiconductor elements can be simplified.

FIGS. 6A to 6L are sectional views for explaining the steps in manufacturing a semiconductor device with a MIS capacitor according to still another embodiment of the present invention. The same reference numerals as in FIGS. 6A to 6L denote the same parts as in FIGS. 2 and 3A to 3H.

Figure 6C:
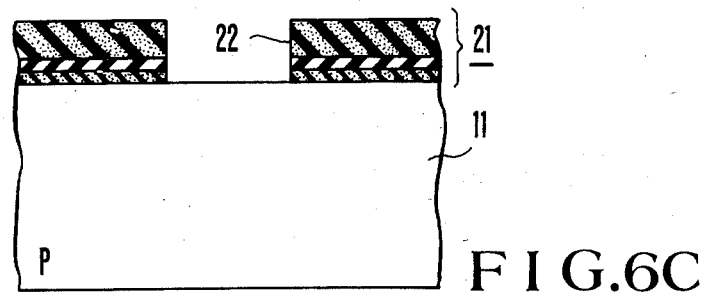

As shown in FIGS. 6A to 6C, a mask layer 21 having a window is formed in the same manner as in FIGS. 3A to 3C.

In this case, the mask layer 21 comprises a three-layer structure having a silicon oxide layer 41 of 300 to 500 Å thickness formed by thermal oxidation on a semiconductor substrate 11, a silicon nitride ($Si_3N_4$) layer 42 of 1,000 to 2,000 Å thickness formed by CVD on the layer 41, and a silicon oxide layer 43 of 5,000 to 10,000 Å thickness formed by deposition on the layer 42.

Figure 6D:
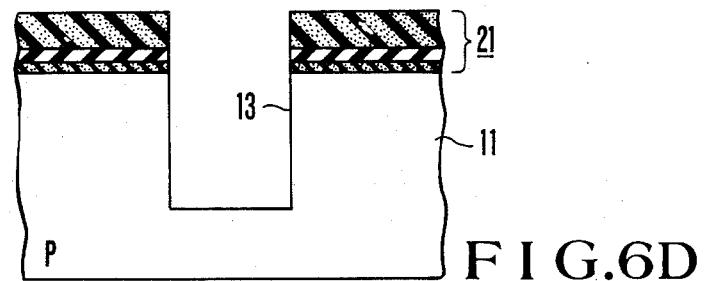

As shown in FIG. 6D, a trench 13 is formed in the semiconductor substrate 11 in the same manner as in the step shown in FIG. 3D.

Figure 6E:
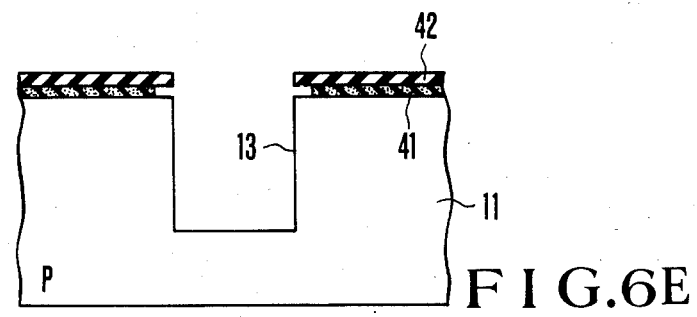

As shown in FIG. 6E, the uppermost layer 43 of the mask layer 21 is removed. In this case, the layer 41 is underetched, but its amount is not important to the present invention. Since the $Si_3N_4$ layer 42 is made of a material different from that of the layers 41 and 43, the layer 42 is left unremoved.

Figure 6F:
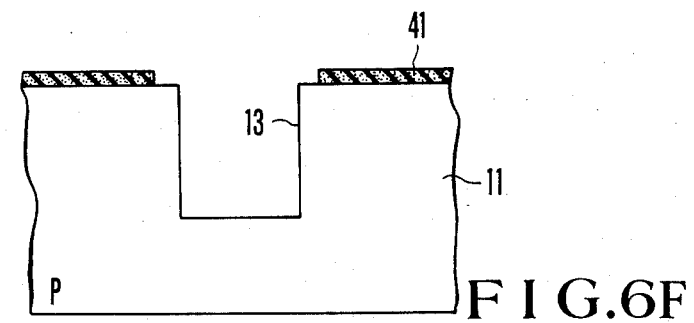

As shown in FIG. 6F, the layer 42 is then removed.

Figure 6G:
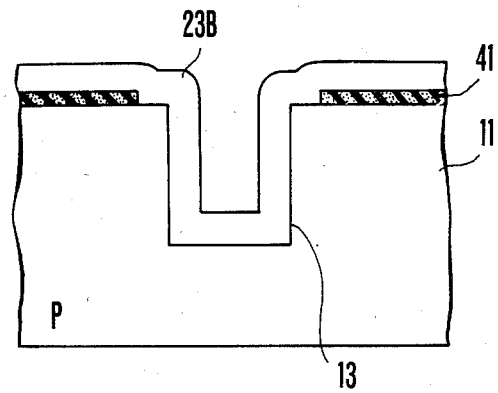

As shown in FIG. 6G, a semiconductor layer 23B is formed in the same step as in FIGS. 3F or 5A.

Figure 6H:
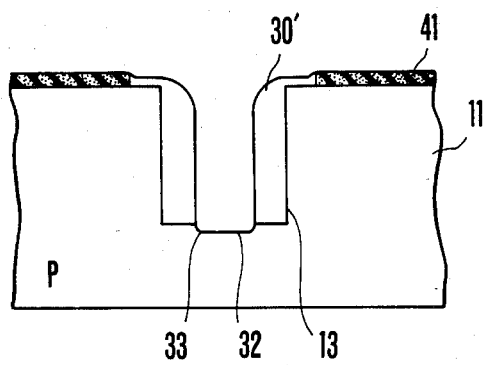

As shown in FIG. 6H, silicon layers 30' similar to the residual semiconductor layers 30 are formed to continue at regions (major surface portions near the edges of the trench 13) without the layer 41 formed on a major surface 11a of the substrate 11.

Figure 6I:
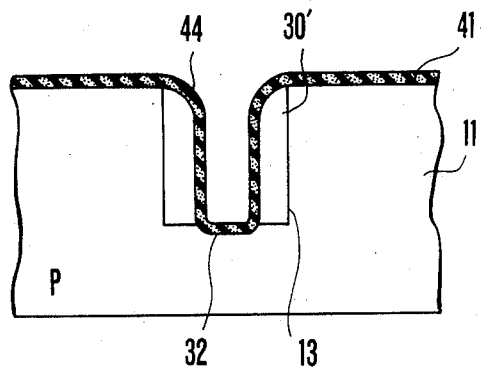

As shown in FIG. 6I, the semiconductor layers 30' and the portion of the surface of the semiconductor substrate at the recess 32 are thermally oxidized to form a silicon oxide ($SiO_2$) layer 44 covering the entire surface of the semiconductor layers and the exposed portion of the major surface 11a of the semiconductor substrate 11.

Figure 6J:
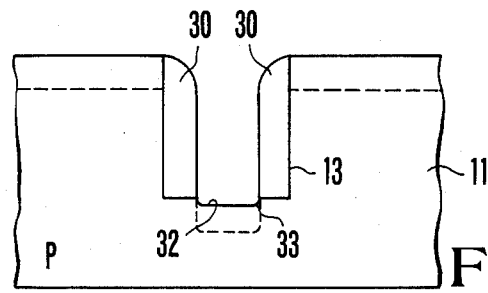

As shown in FIG. 6J, the silicon oxide layer 44 is removed together with the layer 41 to obtain the same semiconductor layers 30 as those in FIG. 5B.

In this manner, the silicon substrate 11 is continuously connected to the semiconductor layers 30 at the edges of the trench without forming steps.

Figure 6K:
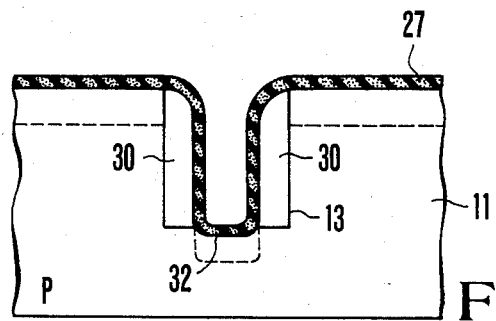
Figure 6L:
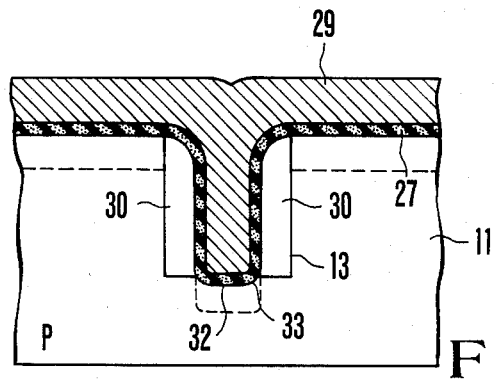

As shown in FIGS. 6K and 6L, a dielectric insulating layer 27 and a conductive layer 29 are sequentially formed in the same manner as in the steps of FIGS. 5C and 5D.

A semiconductor device with a MIS capacitor is prepared in the same manner as in FIG. 5D.

The semiconductor device with a MIS capacitor of the present invention has the same features as described with reference to FIGS. 5A to 5D.

The present invention is not limited to the particular embodiments described above. Various changes and modifications may be made within the spirit and scope of the invention.

In the above embodiments, the semiconductor substrate has a p conductivity type but may be an n conductivity type.

Referring to any embodiments described above, when the semiconductor substrate 11 comprises a p-type substrate and the semiconductor layers 30 comprise n-type layers by doping phosphorus or the like by a known ion implantation technique, n-type semiconductor layers may be formed on the major surface 11a of the substrate 11 and the bottom of the trench 13, thereby charging the capacitor in the same manner as in FIGS. 3A to 3I which illustrate the case wherein the semiconductor substrate 11 comprises a p-type substrate and the semiconductor layer 23A comprises an n-type layer.

What is claimed is:

1. A method of manufacturing a semiconductor layer with a metal-insulator-semiconductor capacitor, comprising the steps of:

forming a trench of a cross-sectionally rectangular shape in a major surface of a semiconductor substrate which has a predetermined conductivity type and which serves as one electrode of said capacitor;

forming a doped semiconductor layer along at least side wall surfaces of said trench, the step of forming said semiconductor layer including the steps of depositing a semiconductor portion so as not to bury said trench with said semiconductor portion and etching at least a part of said semiconductor portion, said semiconductor layer being provided with an outer surface which is formed by deposition and etching, starting to extend in a rounded shape from major surface portions of said semiconductor substrate and extending substantially parallel to said side wall surfaces of said trench, and a recess, which is defined by said semiconductor layer, having round corners at the bottom;

forming a dielectric insulating layer on an exposed surface including said major surface of said semiconductor substrate and said outer surface of said semiconductor layer; and forming a conductive layer on said insulating layer to bury said trench and serving as the other electrode.

2. A method according to claim 1, wherein the step of forming said semiconductor layer includes the steps of: depositing a first doped semiconductor layer on an exposed surface of said major surface of said semiconductor substrate which includes a surface of said trench; and isotropically etching said first doped semiconductor layer to a predetermined thickness so as not to expose the surface of said substrate, thereby rounding corners on an outer surface of said first doped semiconductor layer which correspond to said edges defining said trench and said corners of said recess.

3. A method according to claim 2, wherein the step of forming said trench includes the step of etching damaged layers defining said trench.

4. A method according to claim 1, wherein the step of forming said semiconductor layer comprises the steps of: depositing a first doped semiconductor layer on an exposed surface of said major surface of said semiconductor substrate which includes a surface of said trench; and isotropically etching said first doped semiconductor layer to form second doped semiconductor layers which are respectively provided with outer surfaces formed by deposition and etching, start in a rounded shape from major surface portions of said semiconductor substrate and extend substantially parallel to said side wall surfaces of said trench, said major surface portions corresponding to edges defining said trench, and rounding corners of a recess at the bottom of said trench which is defined by said second doped semiconductor layers.

5. A method according to claim 2, further comprising the step of forming regions which are adjacent to said major surface of said semiconductor substrate and a surface of said recess and have a conductivity type different from that of said semiconductor substrate.

6. A method according to claim 1, wherein the step of forming said dielectric insulating layer comprises the step of stacking insulating films having different dielectric characteristics.

* * * * *